United States Patent [19]

Suzuki et al.

[11] Patent Number: 4,580,100

[45] Date of Patent: Apr. 1, 1986

[54] PHASE LOCKED LOOP CLOCK RECOVERY CIRCUIT FOR DATA REPRODUCING APPARATUS

[75] Inventors: Hiroshi Suzuki, Yokohama; Tadashi Kojima, Tokyo; Mitsuru Nagata, Yokohama, all of Japan

[73] Assignee: Tokyo Shibaura Denki Kabushiki Kaisha 72, Japan

[21] Appl. No.: 563,259

[22] Filed: Dec. 19, 1983

[30] Foreign Application Priority Data

Dec. 17, 1982 [JP] Japan .............................. 57-221307
Dec. 17, 1982 [JP] Japan .............................. 57-221308
Dec. 28, 1982 [JP] Japan .............................. 57-233411
Dec. 28, 1982 [JP] Japan .............................. 57-233444
Dec. 28, 1982 [JP] Japan .............................. 57-233445

[51] Int. Cl.⁴ .......................... H03K 9/00; H03L 7/08
[52] U.S. Cl. .................................... 329/50; 329/122; 331/1 A; 331/17; 331/23; 331/25; 331/27
[58] Field of Search .................. 329/50, 122, 124; 331/1 A, 17, 23, 25, 27

[56] References Cited

U.S. PATENT DOCUMENTS 3,701,039 10/1972 Lang et al. ...................... 331/25 X
3,922,613 11/1975 Allen et al. ..................... 329/122 X
3,982,195 9/1976 Turner ............................ 329/122 X
4,059,805 11/1977 de Laage de Meux et al. ... 329/122 X

*Primary Examiner*—Siegfried H. Grimm
*Attorney, Agent, or Firm*—Finnegan, Henderson, Farabow, Garrett & Dunner

[57] ABSTRACT

A data reproduction circuit, which can be used for reproducing audio data from an optical disc, includes a phase-locked loop which has a circuit for detecting polarity inversions of the input signal, a circuit for comparing the phases of a polarity inversion signal with a reference signal, and circuitry for generating an output clock signal which is phase-locked with the input signal, that clock being used to strobe the input signal to remove fluctuation and jitter from the input signal.

14 Claims, 20 Drawing Figures

PHASE LOCKED LOOP CLOCK RECOVERY CIRCUIT FOR DATA REPRODUCING APPARATUS

BACKGROUND OF THE INVENTION

The present invention relates to a phase-locked loop circuit and a data reproducing apparatus to reproduce synchronizing clock pulses in a digital audio disc player for use with an optical compact disc.

A digital recording and reproduction technique in the field of audio equipment making use of pulse code modulation (hereinafter PCM) has been employed more frequently to achieve the most faithful sound reproduction possible. This technique is called a digital audio system because it has been found in principle that digital audio characteristics do not depend on the recording medium used and are much superior to the conventional analog recording and reproduction. The digital audio system which uses a disc as a recording medium is known as a digital audio disc system.

Various recording and reproducing means including optical, electrostatic and mechanical means have been proposed for digital audio systems. For example, the optical system uses a transparent disc of resin having a diameter of 12 cm and a thickness of 1.2 mm. The disc is covered with a thin metal coating in which pits corresponding to audio signal are formed to exhibit different reflectiveness at different disc locations. The audio signal in an optical system is subjected to a given eight to fourteen modulation (hereinafter EFM), interleaved and converted into a digital signal form by a PCM technique. When the digital signal is reproduced from the disc, the disc is rotated at a constant linear velocity but at a variable rotational velocity of about 200-500 rpm. An optical pickup device incorporating a semiconductor laser and a photoelectric conversion element is operated such that the laser beam is directed from the inner side of the disc toward the outer side to effect a linear tracking.

To reconvert the data in digital form obtained from the optical pickup device back to the original analog audio signal, the EFM signal is obtained by shaping the data reproduced by the optical pickup. A clock signal used for synchronizing signals in various sections of the reproduction system is reproduced from the FM signal through the use of a phase-locked loop (hereinafter PLL). In this case, a phase comparator of the PLL compares the phase of the clock signal from a VCO of the PLL with the phase of the EFM signal to phase lock the two signals. Since the EFM signal is subjected to EFM modulation, the interval at which the polarity inversion takes place varies from 3 bits to 11 bits, assuming that one period of the clock signal is one bit.

FIG. 1 shows a conventional data reproducing system for obtaining a synchronized EFM signal and a clock signal from an input pulse signal obtained from a reproduction system. This reproducing system is explained in greater detail below. The conventional data reproduction system fails to achieve a precise EFM signal and an accurately phase-locked clock signal because the input signal of the circuit, that is, the digital data reproduced from the optical pickup, has a very irregular period from 3 bits to 11 bits. The conventional data means for producing the EFM signal and the clock signal tend to introduce considerable error in the output data.

SUMMARY OF THE INVENTION

The present novel data reproduction apparatus has relatively simple structure and can not only accurately reproduce an EFM signal and a clock signal synchronized with the original recorded data, but can also reproduce synchronized data in a digital audio disc player which uses an optical compact disc.

These and other features are achieved in the phase-locked loop of this invention for generating a reference signal in phase with an input signal comprising means coupled to the input signal for generating a polarity inversion signal indicative of polarity inversions of the input signal, means for comparing the phases of the polarity inversion signal and the reference signal, and means coupled to the phase signal comparing means for generating the reference signal from the phase signal.

One object of the present invention is a PLL which can stably and precisely phase-lock an output signal to an input signal with an irregular period.

Another object of the present invention is such a PLL whose circuit arrangement is relatively simple.

A further object of the present invention is a data reproducing apparatus which introduces little error in its output data signal and can be sufficiently put into practical use.

Additional objects, advantages, and features of the present invention will become apparent to persons skilled in the art from a study of the following description and of the accompanying drawings, in which:

DESCRIPTION OF THE PREFERRED EMBODIMENT

Figure 1:
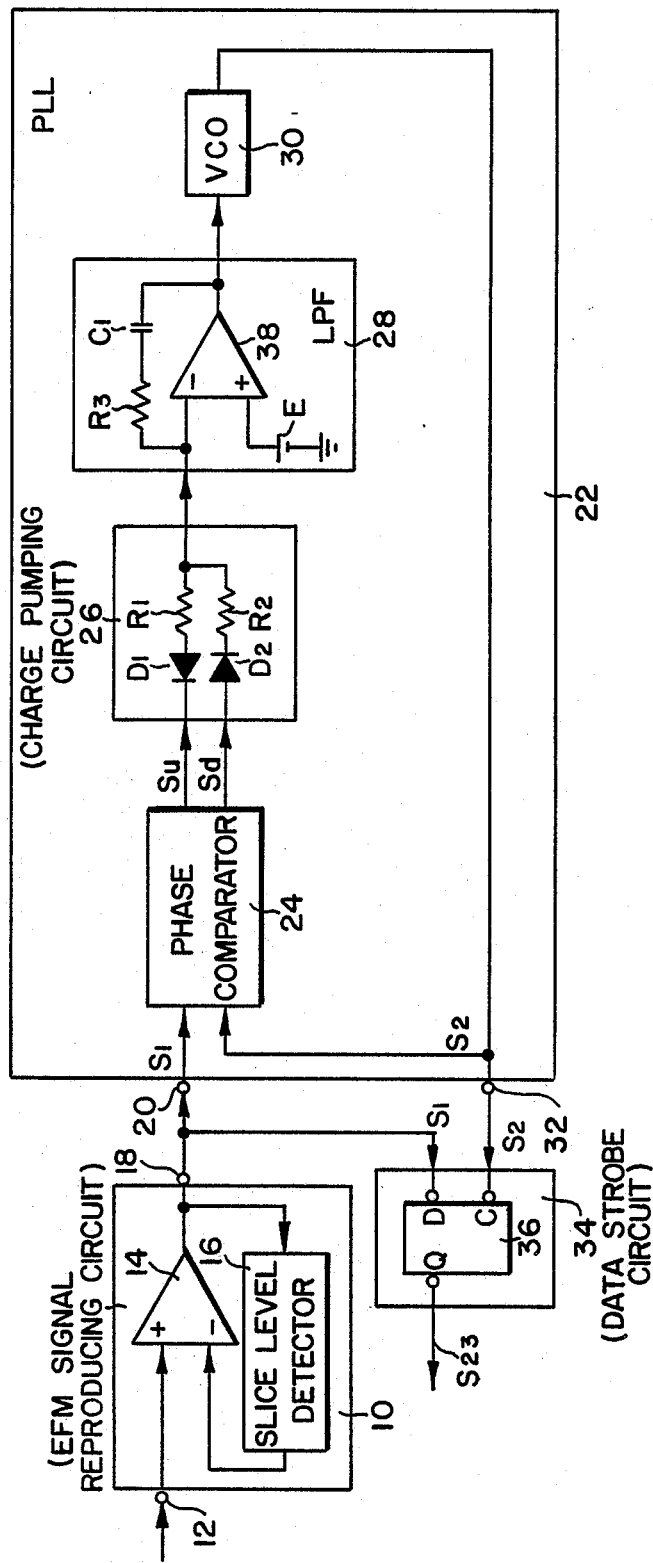
FIG. 1 is a circuit block diagram showing the basic configuration of a conventional data reproducing apparatus.

The present invention will now be described in detail with reference to the accompanying drawings. Throughout the drawings, like reference numerals and letters are used to designate like or equivalent elements for the sake of simplicity of explanation.

FIG. 1 shows the basic configuration for a conventional data reproducing circuit 10 which has an input terminal 12 for receiving an RF signal reproduced from a digital audio disc by an optical pickup (not shown). EFM signal reproducing circuit 10 comprises comparator 14 and slice level detector 16.

Figure 2:
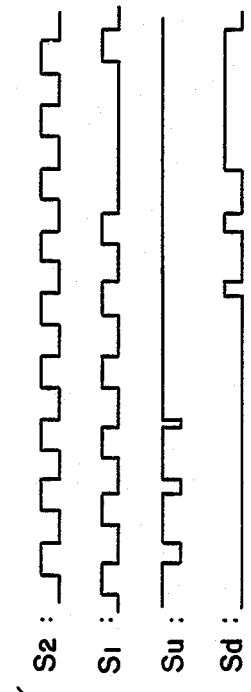
FIG. 2 is a chart showing timing relationships among the signal waveforms associated with the apparatus in FIG. 1.

In EFM signal reproducing circuit 10, comparator 14 is connected at its non-inverted input terminal 16 to RF signal input terminal 12, and at its output terminal to output terminal 18 of EFM signal reproducing circuit 10. The output terminal of comparator 14 is also connected to its inverted signal input terminal through slice level detector 16. An RF signal which is obtained as a deformed pulse signal by the optical pickup, is shaped into a rectangular pulse signal through EFM signal reproducing circuit 10. The rectangular pulse signal, that is, EFM signal $S_1$ having, for example, a waveform as shown in FIG. 2, appears on output terminal 18 of EFM signal reproducing circuit 10.

Output terminal 18 of EFM signal reproducing circuit 10 is connected to input terminal 20 of PLL 22. The purpose of a PLL in this system is to generate a clock of reference signal from the input data; that clock being used to strobe the input data in order to remove fluctuation or jitter in that data. PLL 22 includes phase comparator 24, charge pumping circuit 26, loop filter 28 and VCO 30. In PLL 22, one input terminal of phase comparator 24 is connected to input terminal 20 and the other input terminal of comparator 24 is connected to output terminal 32.

Phase comparator 24 has two output terminals respectively connected to two input terminals of charge pumping circuit 26. The output terminal of charge pumping circuit 26 is connected to the input terminal of loop filter 28. Loop filter 28, which is a low pass filter, will be referred to as LPF. The output terminal of VCO 30 is connected to output terminal 32 of PLL 22 and therefore also to the second input terminal of phase comparator 24.

EFM signal $S_1$ is obtained at EFM signal reproducing circuit 10 and is applied to PLL 22. The phase of EFM signal $S_1$ is compared with the phase of the oscillation output $S_2$ of VCO 30. Phase comparator 24 delivers a frequency increasing signal Su and a frequency decreasing signal Sd corresponding to the phase delay and phase lead, respectively, of the oscillation signal $S_2$ with respect to EFM signal $S_1$. Su and Sd are furnished to VCO 30 via charge pumping circuit 26 and LPF 29 to control the oscillation frequency of VCO 30. In this manner, the oscillation output $S_2$ of VCO 30 is phase-locked with EFM signal $S_1$ and is believed via output signal 32 of PLL 22 to be used as a clock signal for various circuit portions of the CD player (not shown).

Both output terminals 18 and 32 of EFM signal reproducing circuit 10 and PLL 22 are connected to input terminals of data strobe circuit 34. Strobe circuit 32 is a D-type flip flop (DFF) 36. In data strobe circuit 34, data input terminal D of DFF 36 is connected to output terminal 18 of EFM signal reproducing circuit 10, while clock input terminal C of DFF 36 is connected to output terminal 32 of PLL 22. Thus, the EFM signal applied to data input terminal D of DFF 36 is strobed with clock signal $S_2$ which is applied to clock input terminal C of DFF 36. $S_{23}$ is delivered from non-inverted output terminal Q of DFF 36.

Charge pumping circuit 16 consists of diodes D1 and D2 connected in series with resistors R1 and R2. LPF 28 is made up of operational amplifier 38 whose non-inverting input is connected to constant voltage source E and whose inverting input is connected to its output via the series connection of resistor R3 and capacitor C1.

FIG. 2 shows the waveforms of clock signal $S_2$ and EFM signal $S_1$, which FIG. 1 shows as inputs to phase comparator 24. Clock signal $S_2$ lags EFM signal $S_1$, so phase comparator 24 produces at its one output terminal frequency increasing pulse signal Su, shown in FIG. 2, whose low level corresponds to the phase delay of clock signal $S_2$ with respect to EFM signal $S_1$. Su is used to increase the oscillation frequency of VCO 30.

On the other hand, if clock signal $S_2$ leads EFM signal $S_1$, phase comparator 24 produces at its other output terminal frequency decreasing pulse signal Sd having a waveform as shown in FIG. 2 and whose high level corresponds to the phase lead of clock signal $S_2$ with respect to EFM signal $S_1$. Sd is used to reduce the oscillation frequency of VCO 30, thus putting clock signal $S_2$ in phase with EFM signal $S_1$.

In the conventional data reproducing apparatus described above, if clock signal $S_2$ and EFM signal $S_1$ were substantially identical to each other in phase, frequency increasing signal Su and frequency decreasing signal Sd delivered from the output terminals of phase comparator 30 would correspond to the phase difference therebetween. Therefore the signals Su and Sd would be meaningfully used for the phase locking operation of PLL 22. In actual operation, however, the period of EFM signal $S_1$ varies between 3 bits and 11 bits and is irregular in comparison with the period of clock signal $S_2$. The signals Su and Sd delivered from the output terminals of phase comparator 24 fail to correspond to the phase difference and cannot be meaningfully used for the phase locking of PLL 22. Therefore, strobed EFM signal $S_{23}$ delivered from data strobe circuit 34 is not practical for use in the CD player.

Figure 3:
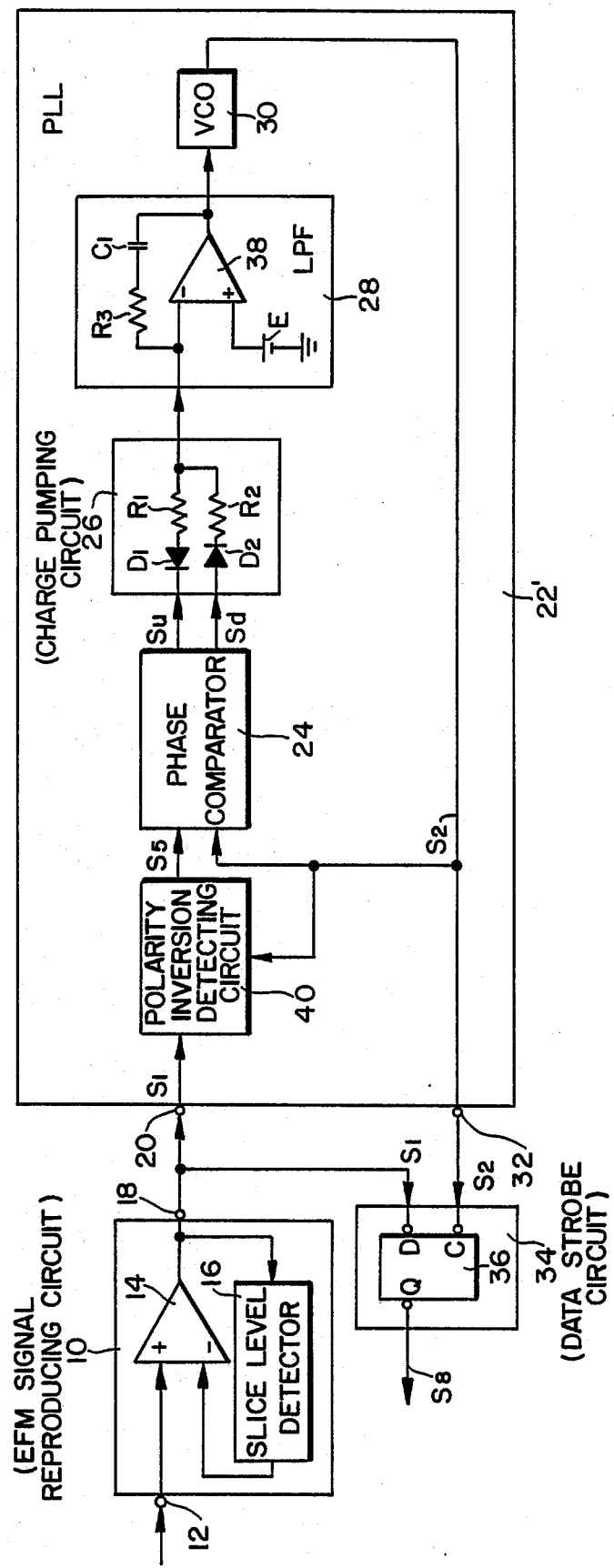
FIG. 3 is a circuit block diagram showing the basic configuration of a data reproducing apparatus according to the present invention.

In reference to FIG. 3, the circuit diagram shown is a data reproducing apparatus constructed according to the present invention. In FIG. 3, an EFM signal reproducing circuit 10 has an input terminal 12 for receiving an RF signal reproduced from a digital audio disc by an optical pickup (not shown). The RF signal, which is obtained as a deformed pulse signal by the optical pickup, is shaped into a rectangular pulse signal through EFM signal reproducing circuit 10. The rectangular pulse signal, that is, EFM signal $S_1$ having, for example, a waveform shown in FIG. 5, appears on output terminal 18 of EFM signal reproducing circuit 10. Output terminal 18 of EFM signal reproducing circuit 10 is connected to input terminal 20 of PLL 22'.

PLL 22' includes polarity inversion detecting circuit 40, phase comparator 24, charge pumping circuit 26, LPF 28 and VCO 30 connected together in a loop. The elements of PLL 22' are equivalent to the corresponding elements in PLL 22 of FIG. 1 except for the additional polarity inversion detecting circuit 40 and a change in phase comparator 24'. The explanations for charge pumping circuit 26, LPF 28 and VCO 30 in FIG. 1 will not be repeated.

Figure 4:
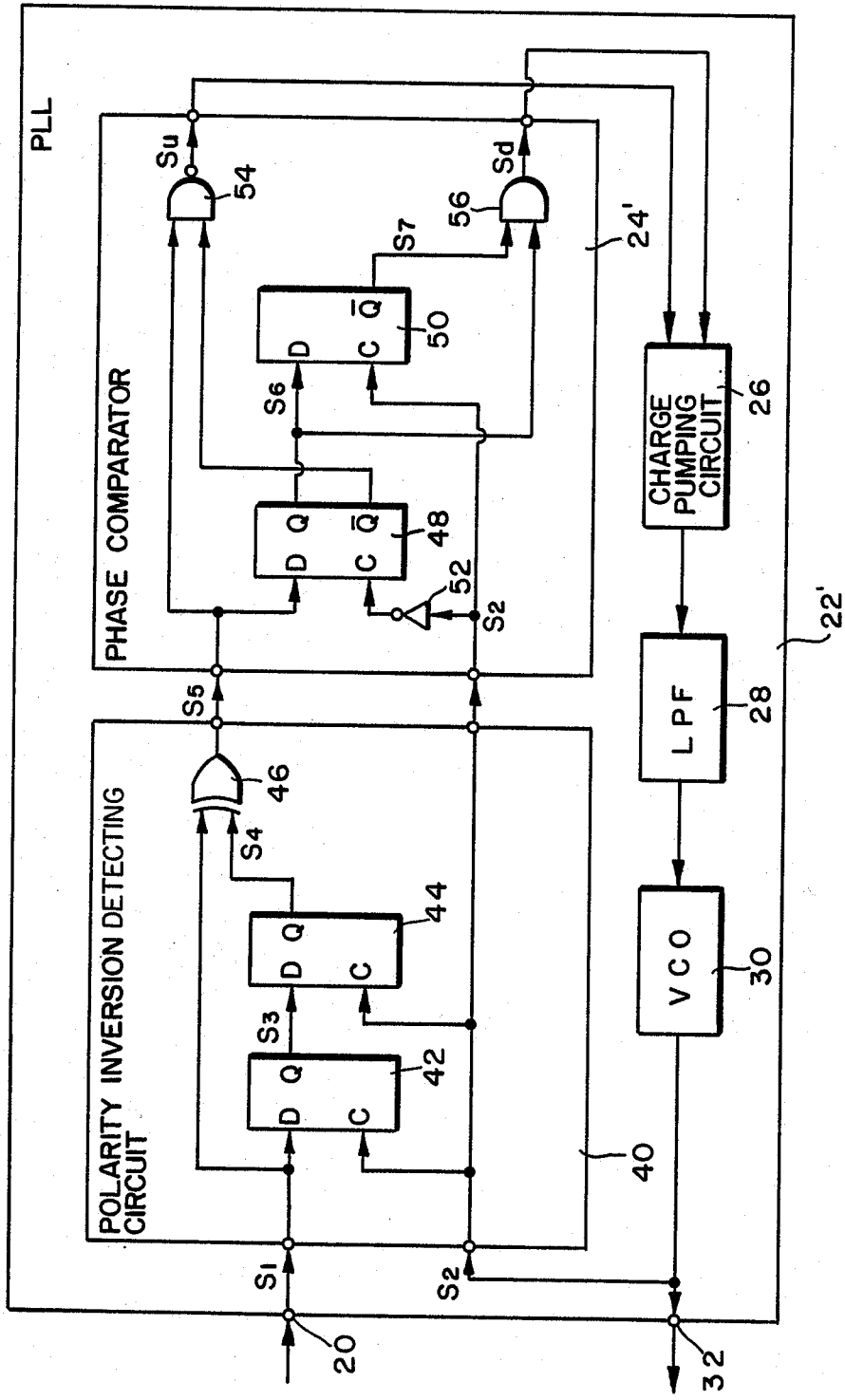
FIG. 4 is a circuit diagram showing one embodiment of the PLL in FIG. 3.

FIG. 4 shows an expanded view of PLL 22' in illustrating polarity inversion detecting circuit 40 and phase comparator 24' in detail. Polarity inversion detecting circuit 40 has DFFs 42 and 44 and EXCLUSIVE-OR gate (hereinafter EX-OR gate) 46. Input terminal 20 of PLL 22' is connected to data input terminal D of first DFF 42 and to one input terminal of EX-OR gate 46. The output terminal of VCO 30 is connected to clock input terminal C of DFFs 42 and 44. Non-inverted output terminal Q of DFF 42 is connected to the data input terminal D of DFF 44, whose non-inverted output terminal Q is connected to the other input terminal of EX-OR gate 46. Output terminal of EX-OR gate 46 is connected to phase comparator 24'.

Phase comparator 24' has DFFs 48 and 50, inverter 52, NAND gate 54 and AND gate 56. The output terminal of EX-OR gate 46 of polarity inversion detecting circuit 40 is connected to data input terminal D of DFF 48 and also to one input terminal of NAND gate 54. Non-inverted output terminal Q of DFF 48 is connected to data input terminal D of DFF 50 and to one input terminal of AND gate 56. Inverted output terminal Q of DFF 48 is connected to the other input terminal of NAND gate 54. Clock input terminal C of DFF 48 is connected to the output terminal of VCO 30 via inverter 52. DFF 50's inverted output terminal $\overline{Q}$ is connected to the other input terminal of AND gate 56 and clock input terminal C is connected to the output terminal of VCO 30. The output terminals of NAND gate 54 and AND gate 56, producing signals Su and Sd, respectively, are connected to charge pumping circuit 26.

Figure 5:
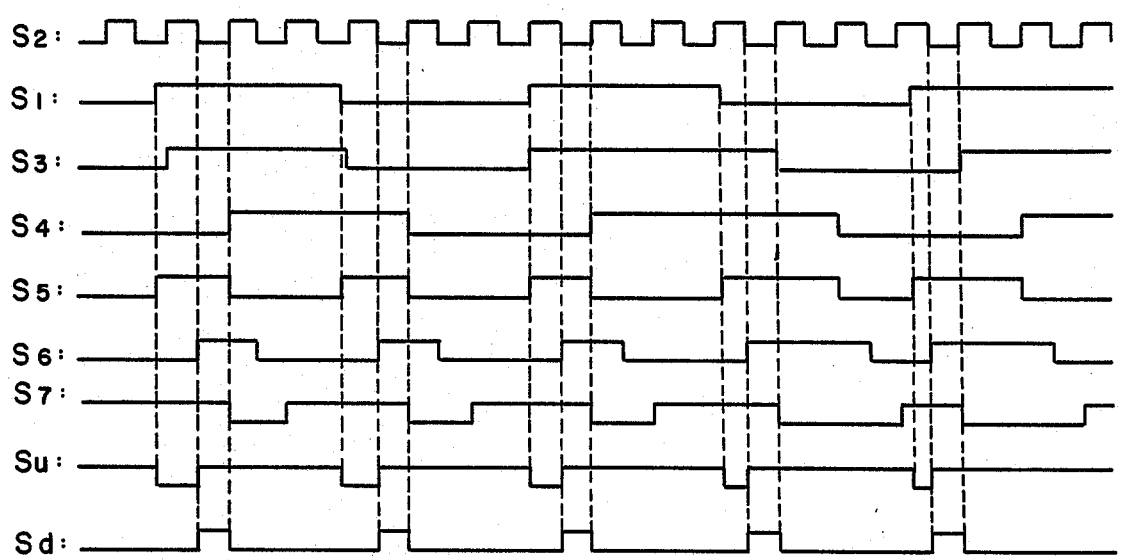
FIG. 5 is a chart showing timing relationships among the signal waveforms appearing at the phase comparator shown in FIGS. 3 and 4.

The operation of PLL 22' will be described using the timing chart shown in FIG. 5. When EFM signal $S_1$ delivered from EFM signal reproducing circuit 10 and clock signal $S_2$ delivered from VCO 30, both shown in FIG. 5, are applied to polarity inversion detecting circuit 40, signal $S_3$ having the waveform shown in FIG. 5, is delivered from non-inverted output terminal Q of first DFF 42 by latching EFM signal $S_1$ at the leading edge of every clock signal $S_2$. Signal $S_4$, having the waveform shown in FIG. 5, is delivered from the non-inverted output terminal Q of DFF 44 by delaying signal $S_3$ about one $S_2$ clock signal period. The delay is accomplished by latching signal $S_3$ at every leading edge of clock signal $S_2$.

Signal $S_5$, shown in FIG. 5, is delivered from EX-OR gate 46 by taking the EX-OR operation of signals $S_1$ and $S_4$. As a result, signal $S_5$ rises upon every polarity inversion of input pulse signal $S_1$ and falls upon every polarity inversion of signal $S_4$.

EX-OR gate 46 supplies signal $S_5$ to data input terminal D of DFF 48. DFF 48 produces at its non-inverted output terminal Q signal $S_6$ (FIG. 5) by latching signal $S_5$ at every trailing edge of signal $S_2$. The reverse of signal $S_6$ is produced at the inverted output terminal $\overline{Q}$ of DFF 48, and this reversed signal $S_6$ and signal $S_5$ are applied to NAND gate 54 which produces signal Su having the waveform shown in FIG. 5.

Su is delivered to one input terminal of charge pumping circuit 26. As shown in FIG. 5, signal Su rises in synchronism with every polarity inversion of EFM signal $S_1$ and falls in synchronism with the fall of clock signal $S_2$ produced immediately after a polarity inversion of EFM signal $S_1$.

Signal $S_6$ from non-inverting output terminal Q of DFF 48 is applied to data input terminal D of DFF 50. Signal $S_7$, shown in FIG. 5, is produced from inverted output terminal $\overline{Q}$ of DFF 50 by latching signal $S_6$ at every leading edge of clock signal $S_2$. Signal $S_7$ is the reverse of signal $S_6$ and delayed from $S_6$ by one half the period of clock signal $S_2$. Signals $S_7$ and $S_6$ are fed to AND gate 56 to form signal Sd shown in FIG. 5 which is delivered to the second input terminal of charge pumping circuit 26. Signal Sd rises in synchronism with every leading edge of signal $S_6$ and falls in synchronism with every fall of signal $S_7$. Thus, signal Sd rises in synchronism with the rise of signal Su and falls in synchronism with the rise of the first clock signal $S_2$ produced after signal Su rises.

Signal Su falls in synchronism with the polarity inversion of EFM signal $S_1$ and rises in synchronism with the trailing edge of first clock signal $S_2$ that is generated thereafter. Signal Sd shown in FIG. 4 rises in synchronism with the leading edge of signal Su and falls in synchronism with the leading edge of the first signal $S_2$ developed thereafter.

From the above description and FIG. 5, it is apparent that the difference between the pulse durations of Su and Sd corresponds to the phase difference between EFM signal $S_1$ and clock signal $S_2$. The situation where signal Su goes low and then signal Sd goes high is allowed only when the polarity inversion of EFM signal $S_1$ takes place. In other words, the aforementioned phase difference is produced only when the polarity inversion of EFM signal $S_1$ occurs.

By using the signals Su and Sd as the frequency increase pulse signal and the frequency decrease pulse signal, respectively, of VCO 30, this invention locks clock signal $S_2$ in phase with EFM signal $S_1$ even if the period of EFM signal $S_1$ is more irregular than that of clock signal $S_2$, i.e., $S_1$'s period is an integer multiple of $S_2$'s period. This provides stable reproduction of clock signal $S_2$ by PLL 22', which is an object of this invention.

Returning to FIG. 3, EFM signal $S_1$ and clock signal $S_2$ are provided to data strobe circuit 34 which then delivers strobed EFM signal $S_8$ strobed by clock signal $S_2$. Strobed EFM signal $S_8$ is set stably because of the stable clock signal $S_2$.

Figure 6:
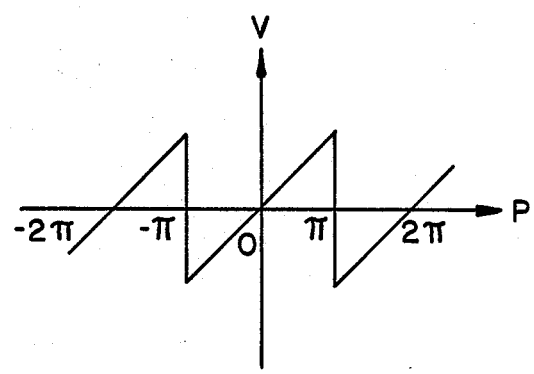
FIG. 6 is a graph showing the phase comparing characteristics of the circuit in FIG. 4.

FIG. 6 shows the graph of the phase locking characteristic of PLL 22' for reproduction of the aforementioned clock signal $S_2$. Specifically, this graph shows the relation between a voltage V of the signal from LPF 29 and the phase difference P between EFM signal $S_1$ and clock signal $S_2$. The voltage V delivered from LPF 28 is based on frequency increase and decrease pulse signals Su and Sd, respectively. As can be seen from FIG. 6, the phase locking characteristic of PLL 22 is substantially sawtooth in shape.

Figure 7:
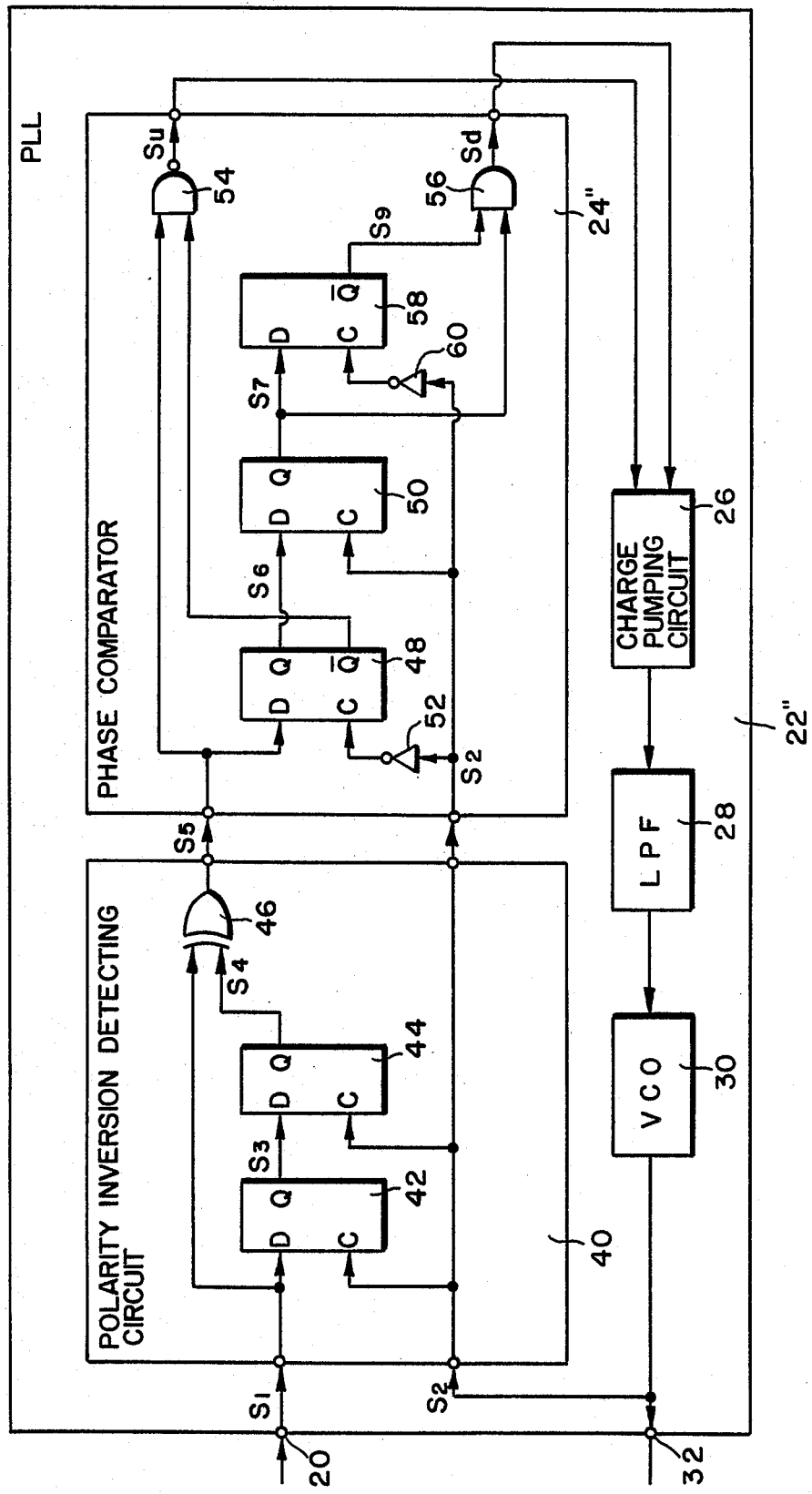
FIG. 7 is a circuit diagram showing another embodiment of the PLL in FIG. 3.

FIG. 7 shows another embodiment of the phase comparator according to the present invention. PLL 22" components polarity inversion detecting circuit 40, charge pumping circuit 26, LPF 28 and VCO 30 are same as those in FIG. 4, and will not be described again.

In FIG. 7, phase comparator 24" is constructed as follows. The output terminal of EX-OR gate 46 of polarity inversion detecting circuit 40 is connected to data input terminal D of DFF 48 and to one input terminal of NAND gate 54. Non-inverted output terminal Q of DFF 48 is connected to data input terminal D of DFF 50. Inverted output terminal $\bar{Q}$ of DFF 48 is coupled to the other input terminal of NAND gate 54. Clock input terminal C of DFF 48 is connected to the output terminal of VCO 30 via inverter 52.

Non-inverted output terminal Q of DFF 50 is connected to data input terminal D of DFF 58 and to the one input terminal of AND gate 56. Clock input terminal C of DFF 50 is connected to the output terminal of VCO 30. DFF 58's inverted output terminal $\bar{Q}$ is connected to the other input terminal of AND gate 56 and clock input terminal C is connected to the output terminal of VCO 30 through inverter 60. The output terminals of NAND gate 54 and AND gate 56 are respectively connected to charge pumping circuit 26.

The operation of PLL 22" will be explained by using timing diagram of FIG. 8. As can be seen from the comparison between FIGS. 4 and 7, signals $S_3$, $S_4$, $S_5$, $S_6$ and Su are equivalent to those same signals in FIG. 4. The waveforms of those signals are the same as those shown in FIG. 5, if EFM signal $S_1$ and clock signal $S_2$ are assumed to be as same as those shown in FIG. 5. Therefore, frequency increase signal Su appearing on the one output terminal of phase comparator 24" falls in synchronism with the polarity inversion of EFM signal $S_1$ and rises in synchronism with the first fall of clock signal $S_2$ produced after polarity inversion of EFM signal $S_1$.

Figure 8:
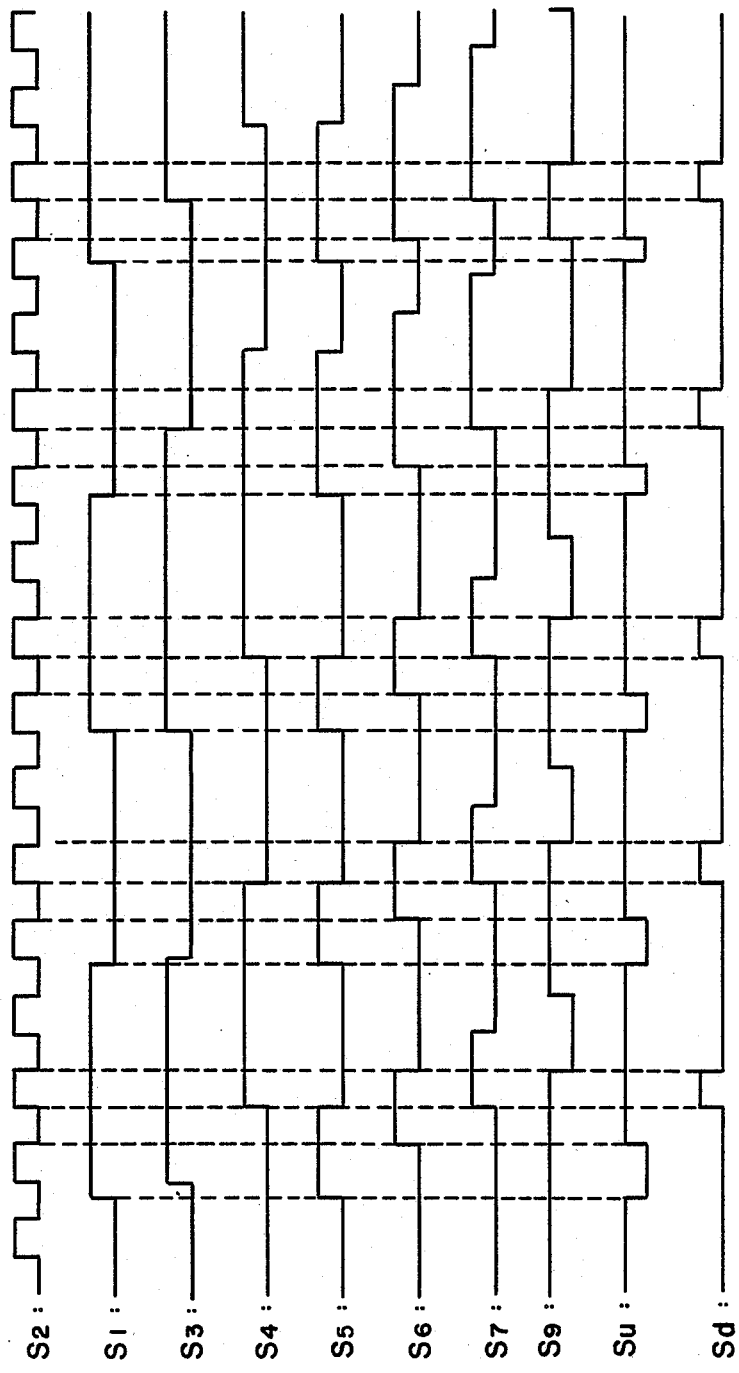
FIG. 8 is a chart showing timing relationships among the signal waveforms of the circuit in FIG. 7.

Meanwhile, since signal $S_6$ from non-inverted output terminal Q of DFF 48 is applied to data input terminal D of DFF 50, signal $S_7$ having the waveform as shown in FIG. 8 is produced from non-inverted output terminal Q of DFF 50 by latching signal $S_6$ at the leading edge of clock signal $S_2$. As a result, signal $S_7$ has a waveform which is delayed from that of signal $S_6$ by one half period of clock signal $S_2$ (See FIG. 8).

DFF 50 supplies signal $S_7$ to data input terminal D of DFF 58 and DFF 58 produces at its inverted output terminal $\bar{Q}$ signal $S_9$, having the waveform shown in FIG. 8, by latching signal $S_7$ at every trailing edge of clock signal $S_2$ applied through inverter 60. Accordingly, signal $S_9$ has the waveform delayed of that of signal $S_7$ by one half period of clock signal $S_2$ and reversed.

Signals $S_9$ and $S_7$ are applied to AND gate 56 to produce frequency decrease signal Sd having the waveform shown in FIG. 8. Sd is delivered to the other output terminal of charge pumping circuit 26. Signal Sd rises one half $S_2$ clock signal period after signal Su rises and falls one half $S_2$ clock signal period later.

Signals Su and Sd are delivered to charge pumping circuit 26 as the frequency increase and decrease signals for VCO 30. Signals Su and Sd produced by the embodiment of FIG. 7 are generally similar to signals Su and Sd produced by the embodiment of FIG. 4, but they differ by one half period of clock signal $S_2$.

The difference between the pulse durations of both signals Su and Sd in FIG. 7 corresponds to the phase difference between EFM signal $S_1$ and clock signal $S_2$. Hence, this embodiment also makes it possible, by using frequency increase and decrease signals Su and Sd, to lock clock signal $S_2$ in phase with an EFM signal $S_1$ whose period is more irregular than that of clock signal $S_2$.

The frequency increase and decrease pulse signals Su and Sd in FIG. 7 are not produced adjacent in time. Specifically, frequency decrease signal Sd rises one half period of clock signal $S_2$ after frequency increase signal Su rises. Hence, frequency increase and decrease signals Su and Sd will not interfere with each other and PLL 22", according to the embodiment of FIG. 7, can attain accurate phase locking.

Figure 9:
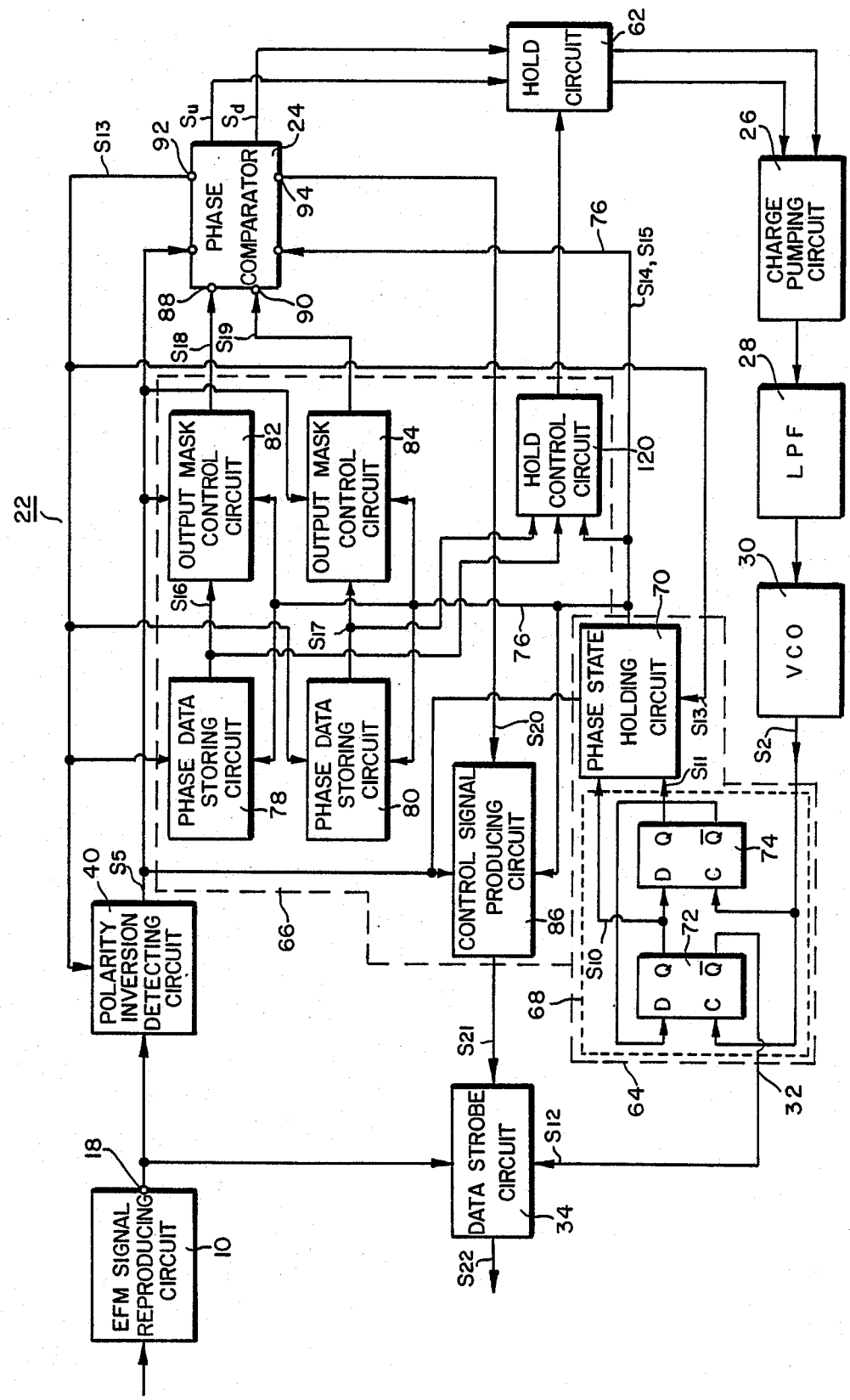
FIG. 9 is a circuit block diagram showing another embodiment of a data reproducing apparatus according to the present invention.
Figure 16:
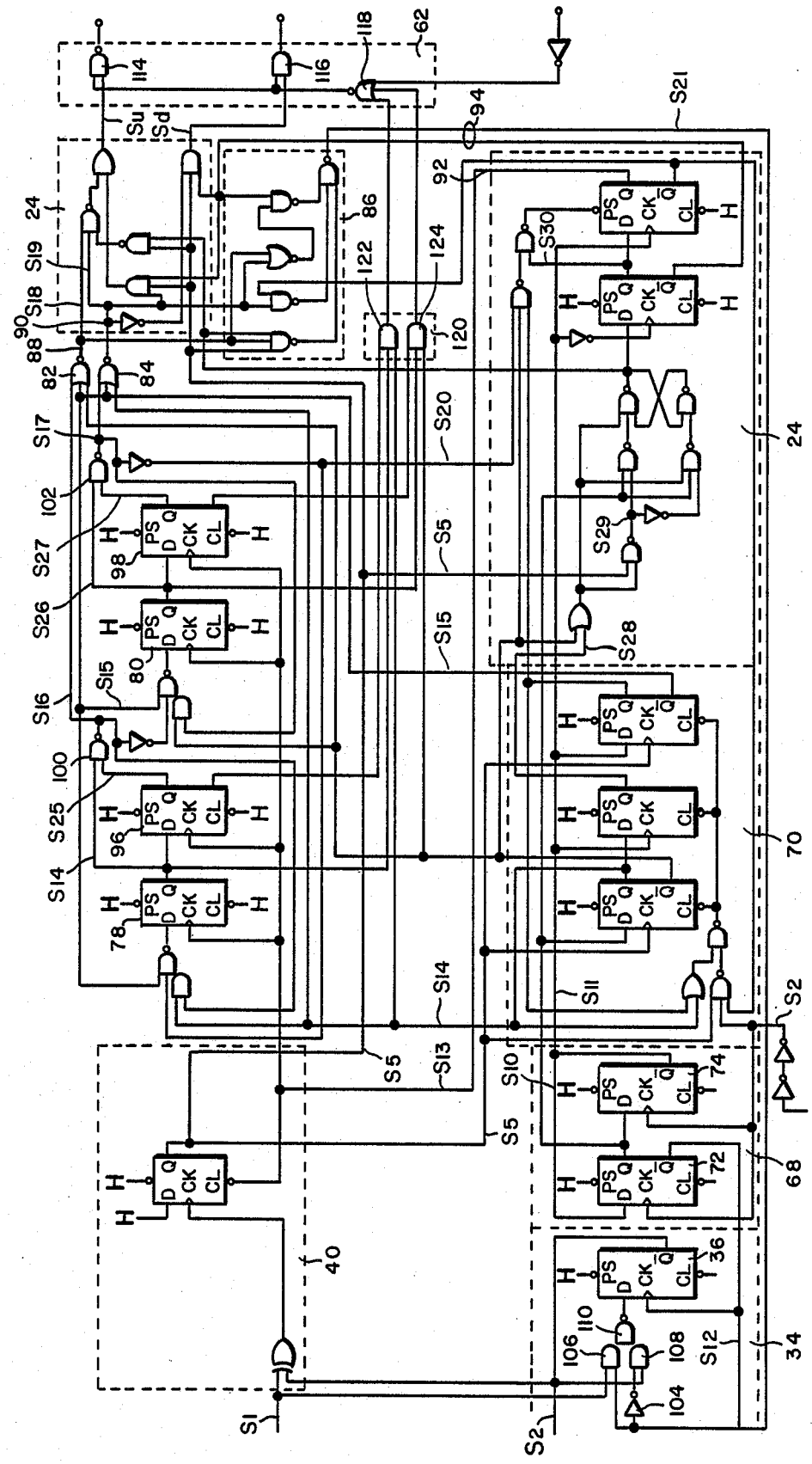
FIG. 16 is a circuit diagram showing detail of the circuit in FIG. 14.

FIG. 9 shows another embodiment of the data reproducing apparatus according to the present invention which includes hold circuit 62, phase condition detecting circuit 64 and control circuit 66. Hold circuit 62 is connected between phase comparator 24* and charge pumping circuit 26 and is explained below. Phase state detecting circuit 64 is connected to the output of VCO 30. Control circuit 66 is connected for controlling phase comparator 24*, data strobe circuit 34 and hold circuit 62 in response to the phase condition of the clock signal $S_2$ which is detected by phase state detecting circuit 64. An example of phase comparator 24* is shown in FIG. 16.

First, phase state detecting circuit 64 and control circuit 66 will be described in detail. Output terminal 18 of EFM signal reproducing circuit 10 is connected to one input terminal of data strobe circuit 34 and also to one input terminal of phase comparator 24* of PLL 22" through polarity inversion detecting circuit 40. Here, phase comparator 24* is constructed according to the embodiments shown in either FIG. 4 or 7. The output terminal of VCO 30 is connected to the other input terminal of data strobe circuit 34 and also to the other input terminal of phase comparator 24* through phase state detecting circuit 64.

Figure 10:
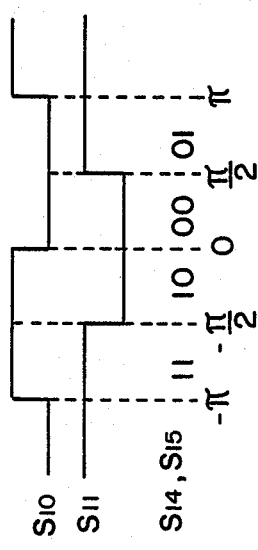
FIG. 10 is a chart for explaining the operation of the phase state holding circuit in FIG. 9.

Phase state detecting circuit 64 comprises frequency divider 68 and phase state holding circuit latch 70. Frequency divider 68 includes DFFs 72 and 74. Clock input terminals C of both DFFs 72 and 74 are connected to the output terminal of VCO 30. Inverted output terminal $\bar{Q}$ of DFF 72 is connected to data strobe circuit 34 through output terminal 32. Non-inverted output terminal Q of DFF 72, which contains signal $S_{10}$, is connected to data input terminal D of DFF 74. Inverted output terminal $\bar{Q}$ of DFF 74, which contains an inverse of signal $S_{11}$, is connected to data input terminal D of DFF 72. Signals $S_{10}$ and $S_{11}$ have one-fourth the frequency of clock signal $S_2$ delivered from VCO 30. Signal $S_{10}$ is delayed from signal $S_{11}$ by one period of clock signal $S_2$, as shown in FIG. 10. Both non-inverted output terminals Q of DFFs 72 and 74, i.e., $S_{10}$ and $S_{11}$, are connected to phase state holding circuit 70. Output data bus 76 from phase state holding circuit 70 is connected to another input terminal of phase comparator 24*.

Control circuit 66 comprises phase data storing circuits 78 and 80, output mask control circuits 82 and 84, control signal producing circuit 86, and hold control circuit 120. Data storing circuits 78 and 80 are connected at their input terminals to data bus 76. The output terminals of data storing circuits 78 and 80 are respectively connected to first and second control input terminals 88 and 90 of phase comparator 24 through output mask control circuits 82 and 84, respectively.

Phase comparator 24* has a pair of control output terminals 92 and 94 as well as output terminals for sending Su and Sd to hold circuit 62. Output terminal 92 is connected to the clear input terminals of polarity inversion detecting circuit 40, phase data storing circuits 78 and 80, output mask control circuits 82 and 84, and phase state holding circuit 70. Output terminal 94 is connected to data strobe circuit 34 through control signal producing circuit 86.

The output terminal of polarity inversion detecting circuit 40 is connected to phase comparator 24*, the clock input terminals of mask control circuits 82 and 84, control signal producing circuit 86, and phase state holding circuit 70. Also, data bus 76 is connected to the other clock terminals of mask control circuits 82 and 84 and of control signal producing circuit 86.

Figure 13:
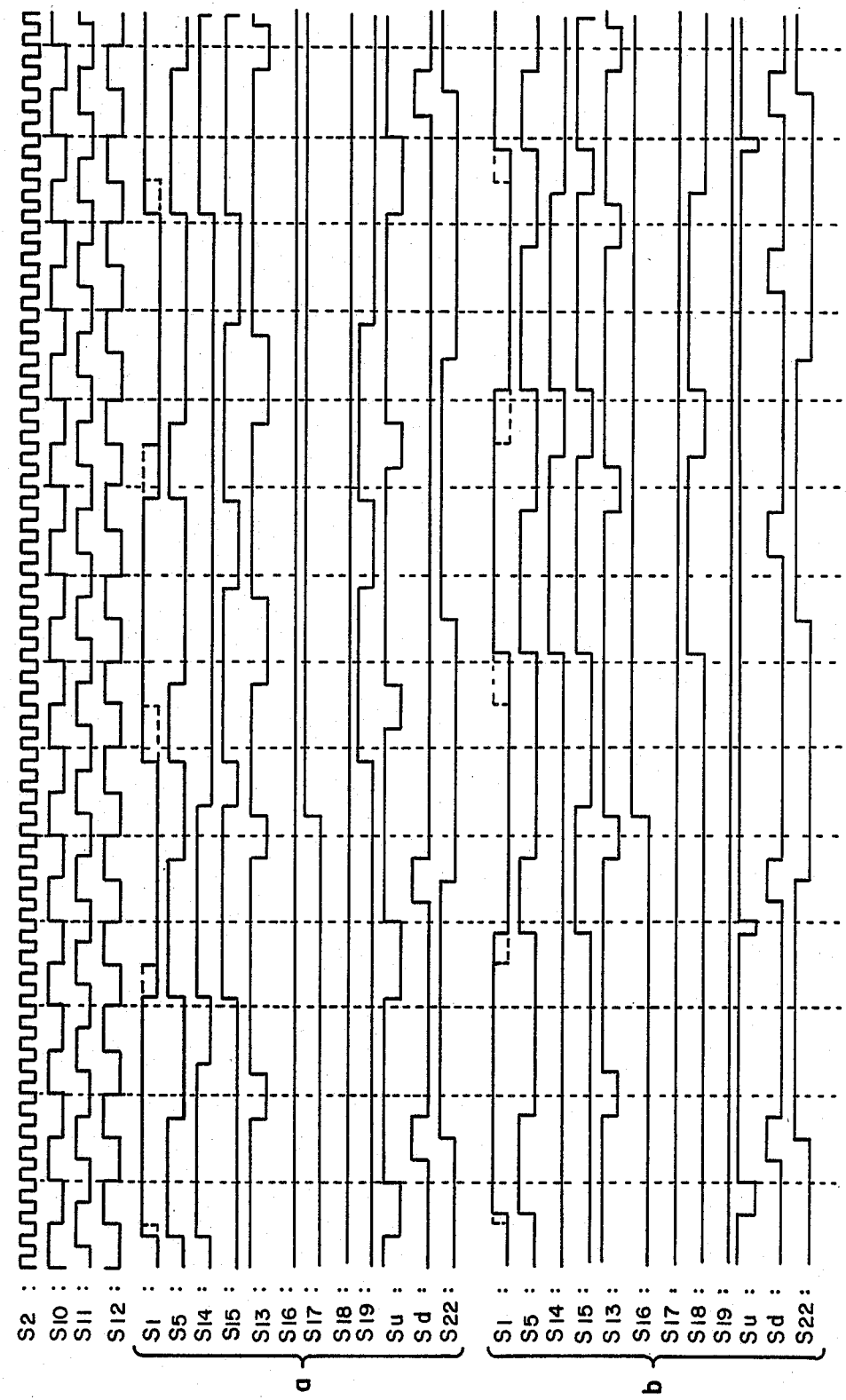
FIG. 13 is a chart showing timing relationships among the signal waveforms of the circuit in FIG. 9.

The operation of the data reproducing apparatus shown in FIG. 9 will be now explained in using FIGS. 10 and 13. The aforementioned EFM signal $S_1$ delivered from EFM signal reproducing circuit 10 is fed to polarity inversion detecting circuit 40 as well as the data strobe circuit 34. Meanwhile, clock signal $S_2$ delivered from VCO 30 is applied to frequency divider 68. Frequency divider 68 delivers signals $S_{10}$ and $S_{11}$ which are out of phase with each other by $\pi/2$. Signal $S_{12}$, which is obtained by reversing signal $S_{10}$, is delivered from inverted output terminal $\bar{Q}$ of DFF 72 and applied to data strobe circuit 34 in place of clock signal $S_2$.

Signals $S_{10}$ and $S_{11}$ are furnished to phase state holding circuit 70, which holds signals $S_{10}$ and $S_{11}$ for synchronism with signal $S_5$ from polarity inversion detecting circuit 40 and control signal $S_{13}$ delivered from control output terminal 92 of phase comparator 24. Phase state holding circuit 70 produces phase state holding signals $S_{14}$ and $S_{15}$ which can assume four logic states (1,1), (1,0), (0,0) and (0,1) (See FIG. 10). The one of the four states at that time which is taken up when signal $S_5$ is supplied is held, and corresponding phase state indicating signals $S_{14}$ and $S_{15}$ are fed into data bus 76.

The four states of the combination of phase state indicating signals $S_{14}$ and $S_{15}$ indicate the range of phase difference P between clock signal $S_2$ and EFM signal $S_1$. More specifically, if the signals $S_{14}$ and $S_{15}$ shown in FIG. 10 assume state (1,1), it turns out that phase difference P lies between $-\pi/2$ and $-\pi$. If the signals $S_{14}$ and $S_{15}$ are in states (1,0), (0,0) and (0,1), phase difference P lies in the ranges from 0 to $-\pi/2$, from 0 to $\pi/2$, and from $\pi/2$ $\pi$, respectively.

Phase state indicating signals $S_{14}$ and $S_{15}$ held in high level as described above, are applied to phase data storing circuits 78 and 80 which either store or fail to store signal $S_{15}$, depending on the value of the signal $S_{14}$, in synchronism with signal $S_{13}$. The negative going edge of $S_{13}$ is synchronised with every trailing edge of signal $S_5$ and thus indicates one cycle operation of signal $S_5$. As can be seen from FIG. 10, if signal $S_{14}$ is "1", then the phase of clock signal $S_2$ is shifted toward the negative region with respect to the phase of EFM signal $S_1$. If $S_{14}$ is "0", the phase of clock signal $S_2$ is shifted toward the positive region with respect to the phase of EFM signal $S_1$. When signal $S_{15}$ is "0," phase difference P lies between $\pi/2$ and $\pi/4$.

Phase data storing circuit 78 stores the value of signal $S_{15}$ in synchronism with signal $S_{13}$ only when signal $S_{14}$ is "0." Phase data storing circuit 80 stores the value of signal $S_{15}$ in synchronism with signal $S_{13}$ only when signal $S_{14}$ is "1."

The contents of phase data storing circuits 78 and 80 are applied as phase data signals $S_{16}$ and $S_{17}$, respectively, to first and second output mask control circuits 82 and 84, respectively. Output mask control circuit 82 delivers signal $S_{18}$ for masking Su in synchronism with polarity inversion detecting signal $S_5$ only when phase data signal $S_{16}$ is "1" and phase state indicating signals $S_{14}$ and $S_{15}$ are in state (1,1). Outer mask control circuit 84 delivers signal $S_{19}$ for masking signal Sd in synchronism with polarity inversion detecting signal $S_5$ only when phase data signal $S_{17}$ is "1" and phase state indicating signals $S_{14}$ and $S_{15}$ are in state (0,1).

Usually, phase comparator 24* compares the phase of the polarity inversion detecting signal $S_5$ with the phases of phase state indicating signals $S_{14}$ and $S_{15}$ and delivers frequency increase or decrease signal Su or Sd corresponding to the phase delay or phase advance of clock signal $S_2$ in respect to EFM signal $S_1$. When output masking signals $S_{18}$ and $S_{19}$ are both "1", phase comparator 24* is prevented from producing the signals Su and Sd, respectively. When these signals Su and Sd terminate, phase comparator 24* produces the aforementioned one cycle operation indicating signal $S_{13}$ to clear polarity inversion detecting circuit 40 and phase state holding circuit 70.

In one situation, if phase difference P increases and exceeds the limit of the phase comparison ability of phase comparator 24*, that is, exceeds $\pi$, at some instant, while phase data signal $S_{17}$ is "1", that is, while phase difference P lies in the range from $\pi/2$ to $\pi$. This means, as can be seen from FIG. 10, that phase difference P has moved the range from $-\pi$ to $-\pi/2$ when viewed from phase state indicating signals $S_{14}$ and $S_{15}$ due to the succeeding phase state detecting clock signals $S_{10}$ and $S_{11}$. Accordingly, during this interval, signals $S_{14}$ and $S_{15}$ assume state (1,1). Therefore, output mask control circuit 82 delivers output masking signal $S_{18}$, and phase comparator 24* delivers only frequency decrease pulse signal Sd. As a result, VCO 30 is controlled so that its oscillation frequency may be reduced.

In another situation, phase difference P decreases past $-\pi$ while phase data signal $S_{17}$ is "1", that is, phase difference P lies in the range from $-\pi/2$ to $-\pi$. This means that phase difference P is brought into the range from $\pi/2$ to $\pi$ when viewed from phase state indicating signals $S_{14}$ and $S_{15}$. Hence, these signals $S_{14}$ and $S_{15}$ take on state (0,1). Output mask control circuit 84 then produces output masking signal $S_{19}$ for masking the production of frequency decrease signal Sd at phase comparator 24, and phase comparator 24 delivers only frequency increase signal Su. Consequently, VCO 30 is controlled in such a manner that its oscillation frequency increases.

Figure 11:
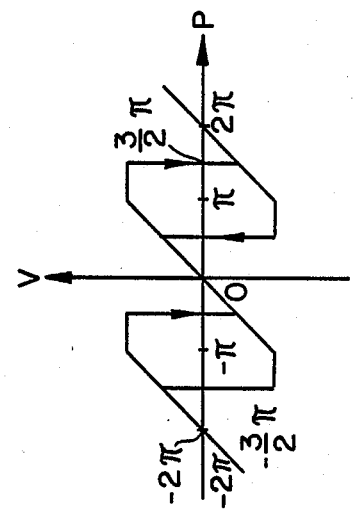
FIG. 11 is a graph showing phase comparison characteristics of the circuit in FIG. 9.

FIG. 11 shows the relationship between P, the phase difference between clock signal $S_2$ and EF signal $S_1$, and the output voltage V delivered from LPF 28. The graph shown in FIG. 11 reveals that hysteresis appears when phase difference P exceeds $-\pi$ and $\pi$, thus substantially extending the range in which phase difference P can be zero.

Figure 12:
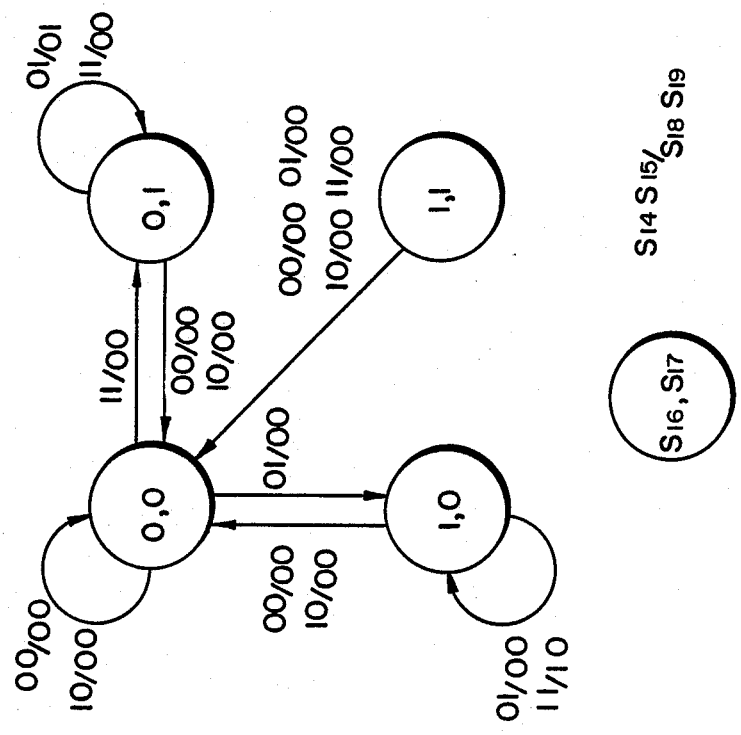
FIG. 12 is a logic state transition diagram for explaining the operation of the circuit in FIG. 9.

FIG. 12 shows the manner in which the aforementioned four states assumed by phase data signals $S_{16}$ and $S_{17}$ change by variations in phase state indicating signals $S_{14}$ and $S_{15}$ and output masking signals $S_{18}$ and $S_{19}$.

FIG. 13 is a timing diagram of waveforms appearing at various portions of the block diagram on FIG. 9. Group (a) in FIG. 13 shows the case where phase difference P is moving toward the negative region, while group (b) in FIG. 13 shows the case where phase difference P is moving toward the positive region.

Data strobe circuit 34 generates EFM signal $S_{22}$ based on control signal $S_{21}$ delivered from control signal producing circuit 86.

Figure 14:
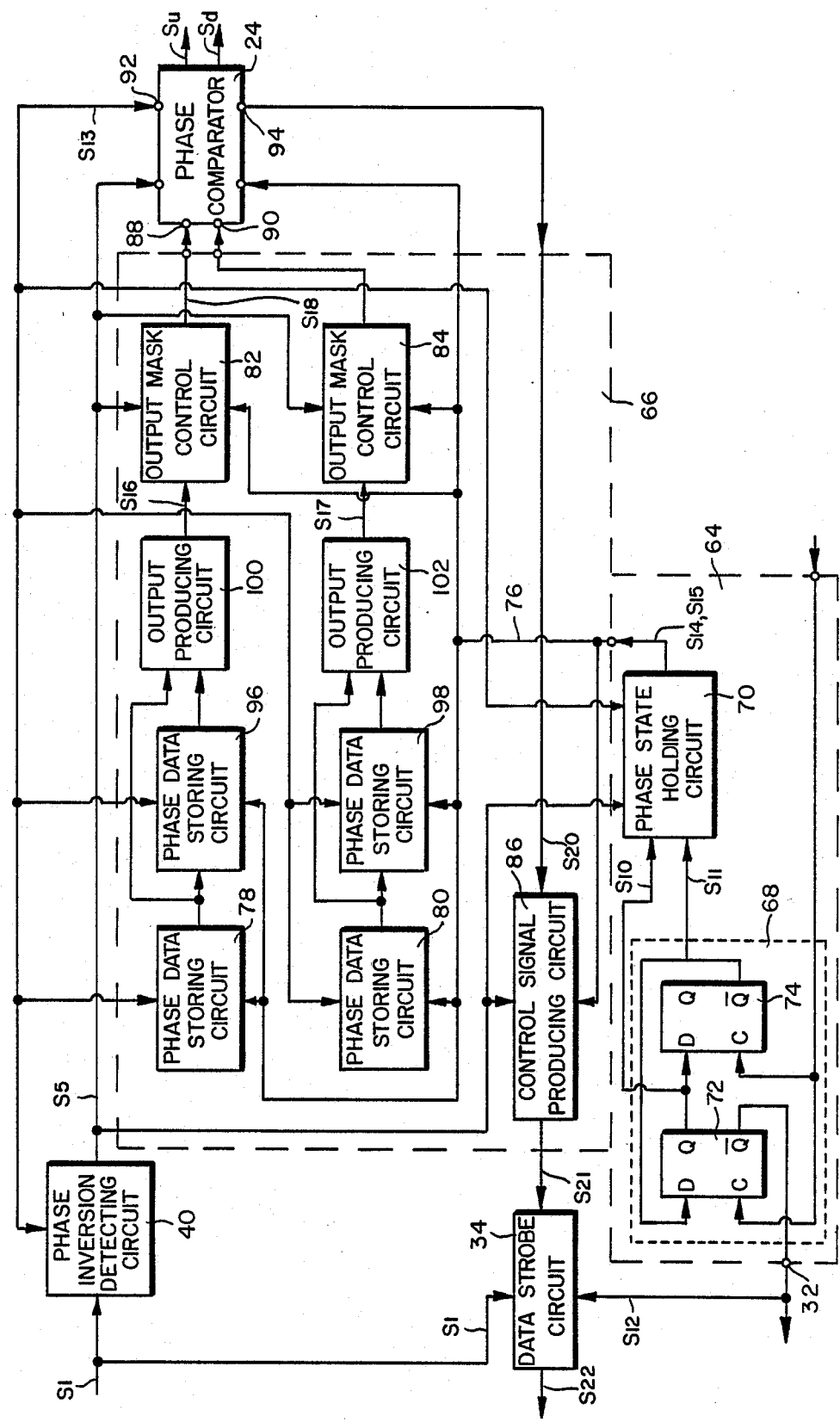
FIG. 14 is a circuit block diagram showing a modification of the circuit shown in FIG. 9.

FIG. 14 shows a part of the data reproducing apparatus including a modification of control circuit 66' according to the present invention. As shown, control circuit 66' also includes phase data storing circuits 96 and 98 and phase data signal producing circuits 100 and 102 for producing phase data signals $S_{16}$ and $S_{17}$. As can be seen from FIG. 15, during the process of transitions from state (0,0) to (0,1) and to (1,0), the phase state indicating signals $S_{16}$ and $S_{17}$ assume states (0,0') and (0'',0), respectively. This allows more precise judgment of whether EFM signal $S_1$ tends to lead or lag clock signal $S_2$.

Specifically when $S_{17}$ is 0', one of the output logic states of phase data storing circuits 78 and 96 is "1" and the other is "0". Thus $S_{17}$ stays "0". If both output logic states of phase data storing circuits 78 and 96 change to "1", $S_{17}$ becomes "1". When $S_{16}$ is 0'', only one of the phase data storing circuits is "1".

Figure 17:
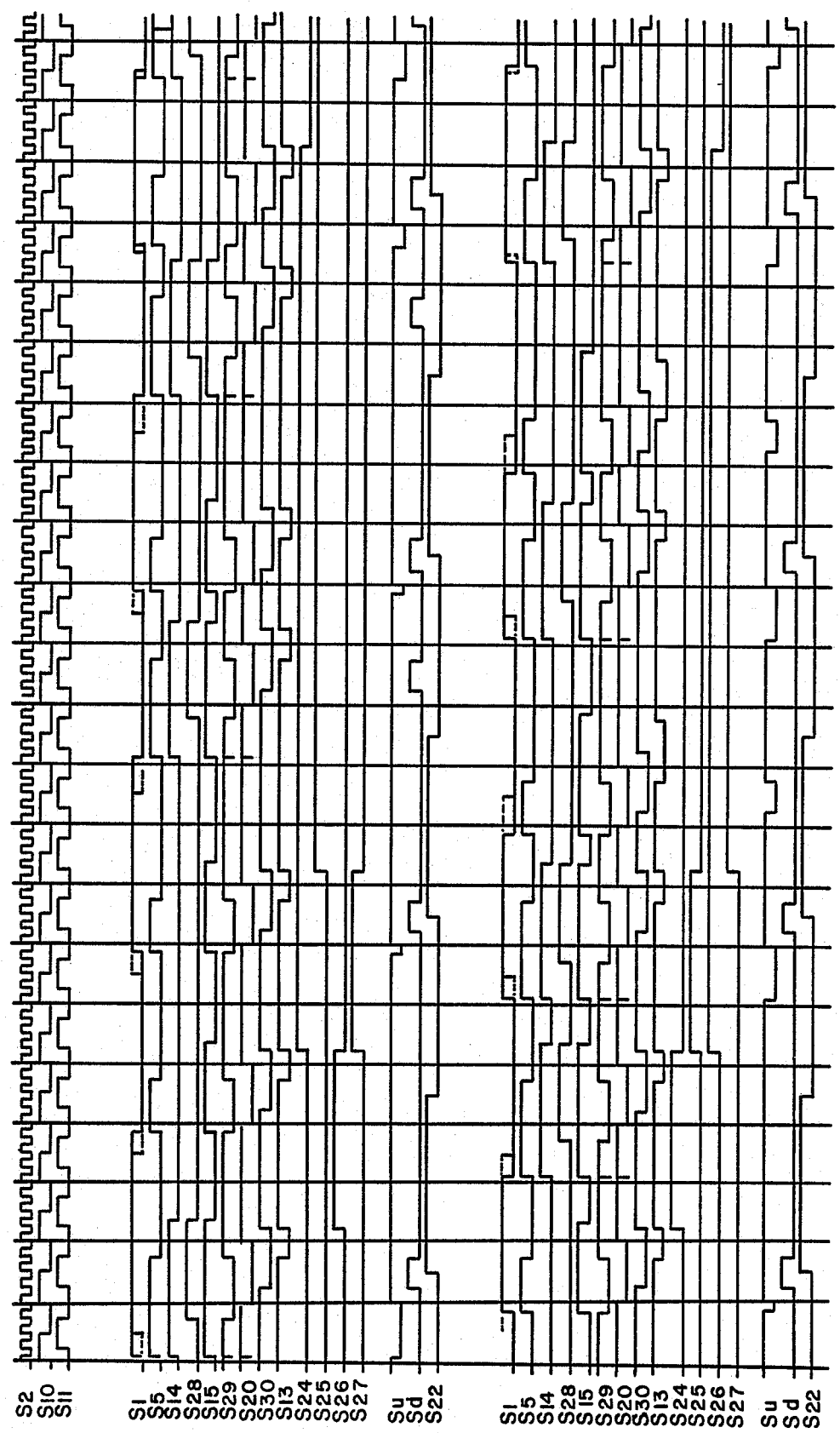
FIG. 17 is a chart showing timing relationships among the signal waveforms of the circuit in FIG. 16.

Details of portions of the circuit diagram of FIG. 14 and the timing chart of signals appearing thereon are shown in FIGS. 16 and 17, respectively. The operation of the circuit of FIG. 16 will be easily understood by reference to the explanation for the circuit of FIG. 9 and the timing chart of FIG. 17. Waveforms of signals $S_{24}$ and $S_{30}$ appear in the circuit on FIG. 16 and are shown in FIG. 17.

Figure 18:
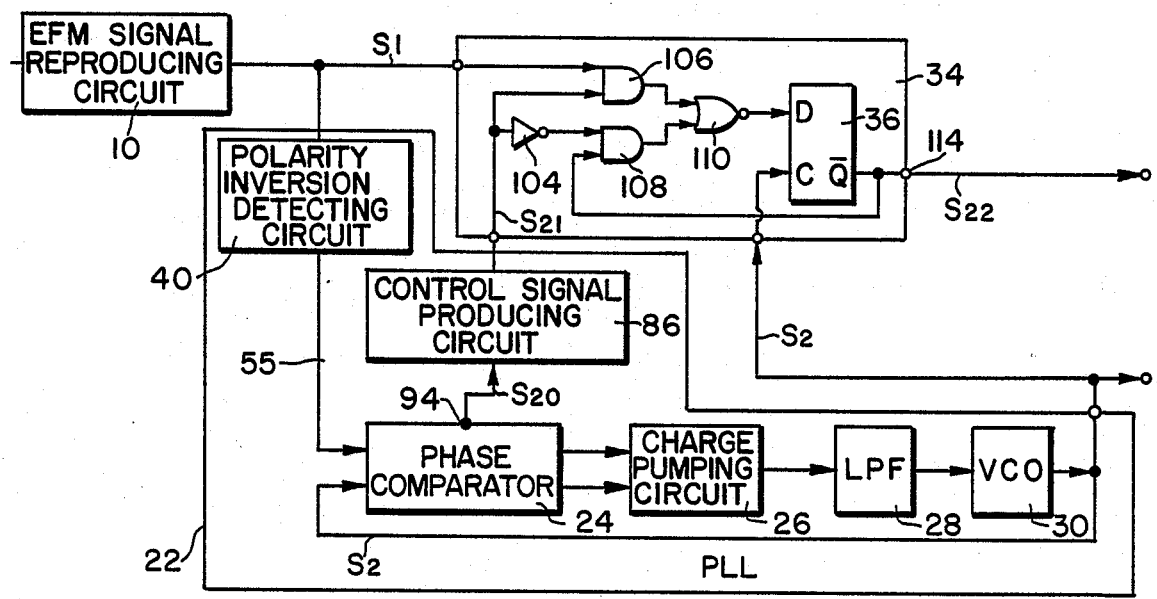
FIG. 18 is a circuit diagram showing an embodiment of the data strobe circuit 34 in FIG. 9.

FIG. 18 shows a detailed circuit diagram of data strobe circuit 34' of FIG. 9, which is also an improvement over the conventional strobe circuit 34 shown in FIG. 1. As shown, signal $S_{20}$ delivered from control output terminal 94 of phase comparator 24 is applied to control signal producing circuit 86. In FIG. 9, control signal $S_{21}$ is produced under the control of signals $S_5$, $S_{14}$ and $S_{15}$. That is, when frequency increase and decrease masking signals $S_{18}$ and $S_{19}$, respectively, are supplied to phase comparator 24, i.e., phase difference P between EFM signal $S_1$ and clock signal $S_2$ lies in the range from $\pi/2$ to $\pi$ or from $-\pi/2$ to $-\pi$, as shown in the circuit in FIG. 18, if phase difference P at the instant of the polarity inversion of the next pulse of EFM signal $S_1$ is more than $\pi$ or less than $-\pi$, signal $S_{20}$ is delivered from phase comparator 24. Control signal producing circuit 86 senses that phase difference P lies in the range from $\pi/2$ to $3\pi/2$ or from $-\pi/2$ to $-3\pi/2$ (see FIG. 11) and thus has entered the hysteresis region of the phase comparison characteristic based on signals $S_{21}$, $S_{14}$, $S_{15}$ and $S_5$. Control signal producing circuit 86 then sets $S_{21}$ to "1".

Control signal $S_{21}$ from control signal producing circuit 86 is sent to data strobe circuit 34. Data strobe circuit 34 according to the invention includes inverter 104, AND gates 106 and 108, NOR gate 110, and DFF 36. EFM signal $S_1$ from EFM signal reproducing circuit 10 is applied to one input terminal of AND gate 106. Control signal $S_{21}$ delivered from control signal producing circuit 86 is applied to another input terminal of AND gate 106 and also to one input terminal of AND gate 108 through inverter 104. Both output terminals of AND gate 106 and 108 are connected to input terminals of NOR gate 110.

The output terminal of NOR gate 110 is connected to data input terminal D of DFF 36, while clock input terminal C of DFF 36 is connected to $S_2$ from the output terminal of VCO 30 in PLL 22. Inverted output terminal $\bar{Q}$ of DFF 36 is connected to another input terminal of second AND gate 108 as well as to output terminal 114 of data strobe circuit 34. Output signal from DFF 36 is delivered to output terminal 114 of data strobe circuit 34 as strobe EFM signal $S_{22}$. Clock signal $S_2$ delivered from VCO 30 is transmitted via output terminal 32 of PLL 22.

Figure 19:
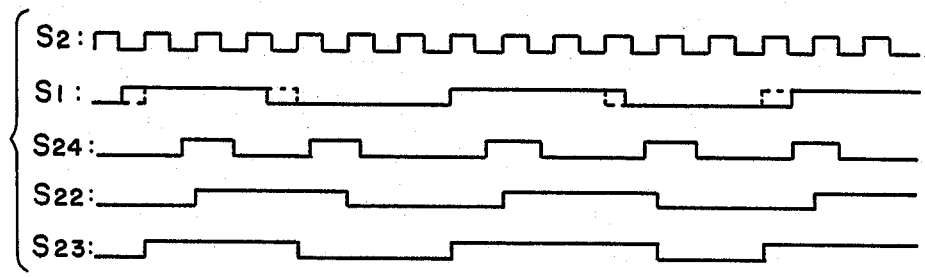
FIG. 19 is a chart comparing the timing relationships among the signal waveforms of the circuit in FIG. 18 with the conventional circuit shown in FIG. 1.

If EFM signal $S_1$ and clock signal $S_2$ lie in the hysteresis region of the phase characteristic shown in FIG. 11, control signal producing circuit 86 delivers control signal $S_{21}$ having waveform as shown in FIG. 19. The pulse duration of control signal $S_{21}$ is equivalent to one period of clock signal $S_2$.

EFM signal $S_{22}$, which is strobed by clock signal $S_2$ shown in FIG. 19, is delivered from inverted output terminal $\bar{Q}$ of DFF 36. If control signal $S_{21}$ is "1", a polarity inversion of EFM signal $S_1$ has occurred. This makes it possible to obtain strobed EFM signal $S_{22}$ with minimal error even though signal $S_1$'s phase fluctuates due to jitter from the reproduction of the disc. The conventional data strobe circuit shown in FIG. 1 would produce a strobed EFM signal $S_{23}$ having the waveform shown in FIG. 19, which is erroneous.

In the above embodiment, DFF 36 is not controlled only by clock signal $S_2$ delivered from VCO 30 to obtain strobed EFM signal $S_{22}$. Instead, the time during which EFM signal $S_1$ is produced is also controlled according to the information concerning phase from circuit 86, and a strobed EFM signal is sent to DFF 36. Consequently, strobed EFM signal $S_{22}$ derived from DFF 36 involves fewer errors and the configuration can be put into practical use.

Figure 20:
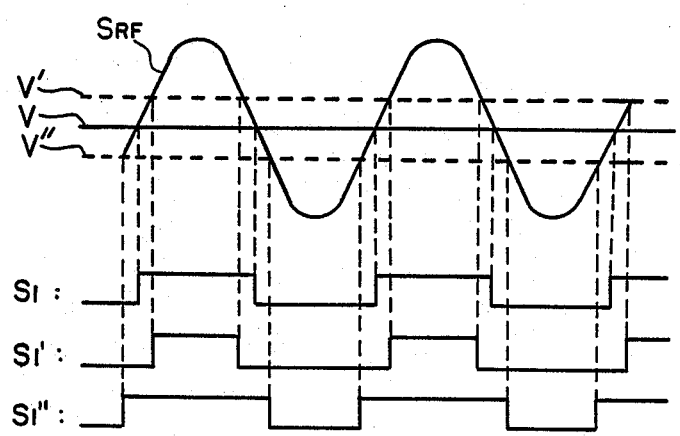
FIG. 20 is a chart for explaining the variations of the EFM signal detected from EFM signal reproducing circuit in FIG. 9 or 14 caused by a fluctuation of a reference signal.

Hold circuit 62 shown in FIG. 9 can now be explained with reference to FIG. 20. Hold circuit 62 is constructed, as shown in FIG. 16, by NAND gate 114, AND gate 116, and NOR gate 118. NAND gate 114 is connected at its one input terminal to the one output terminal of phase comparator 24 for frequency increase signal Su. The output terminal of NAND gate 114 is connected to the one input terminal of charge pumping circuit 26. One input terminal of AND gate 116 is connected to the other output terminal of phase comparator 24* for frequency decrease signal Sd. The output terminal of AND gate 116 is connected to the other input terminal of charge pumping circuit 26. The other input terminals of NAND gate 114 and gate 116 are connected in common to the output terminal of NOR gate 118.

Two input terminals of NOR gate 118 are respectively connected to the output terminals of hold control circuit 120. Hold control circuit 120 includes two AND gates 122 and 124. The input terminals of AND gate 122 are connected to phase data storing circuits 78 and 96 and to phase state holding circuit 70. The input terminals of AND gate 124 are connected to phase data storing circuits 80 and 98 and to phase state holding circuit 70.

In EFM signal reproducing circuit 10, EFM signal $S_1$ is obtained by comparing the RF signal delivered from the laser pickup (not shown) with a reference signal delivered from slice level detector 16, as described above. Assume that the RF signal has waveform $S_{RF}$ as shown in FIG. 20, and the slice level V of the reference signal drifts upward or downward as indicated by the broken lines V' or V''. This causes the waveform of EPM signal $S_1$ to change to the waveforms $S_1'$ and $S_1''$. As the leading and the trailing edges of EFM signal $S_1'$ or $S_1''$ would lead or trail those of EFM signal $S_1'$ despite the fact that the phases of EFM signals $S_1$, $S_1'$ and $S_1''$ are the same as each other. This would render PLL 22 unstable and make clock signal $S_2$ unstable in the conventional data reproducing apparatus as shown in FIG. 1.

EFM signal $S_1$ with the alternate phase drift of the edges is compared with clock signal $S_2$. The component of the phase difference signal from phase comparator 24* which is attributed to the alternate phase drift in EFM signal $S_1$ is detected by the combination of phase state holding circuit 70, phase data storing circuits 78, etc., and hold control circuit 120, all shown in FIG. 16. The phase data stored in phase data storing circuit 78, for example, is combined with the succeeding phase data delivered from phase state holding circuit 70 at AND gate 122. A control signal is delivered from AND gate 122 of hold control circuit 120 to NAND gate 114 of hold circuit 62 for opening NAND gate 122 to prevent transfer of frequency increase signal Su if the alternate phase drift has occurred. When NAND gate 114 is opened, the input terminal of charge pumping circuit 26 assumes an open state. Then, the output voltage from LPF 28 is held at the value which was assumed immediately before the hold circuit 62 is opened. Consequently, VCO 30 produces clock signal $S_2$ according to the held voltage, thus preventing clock signal $S_2$ from becoming unstable.

Figure 15:
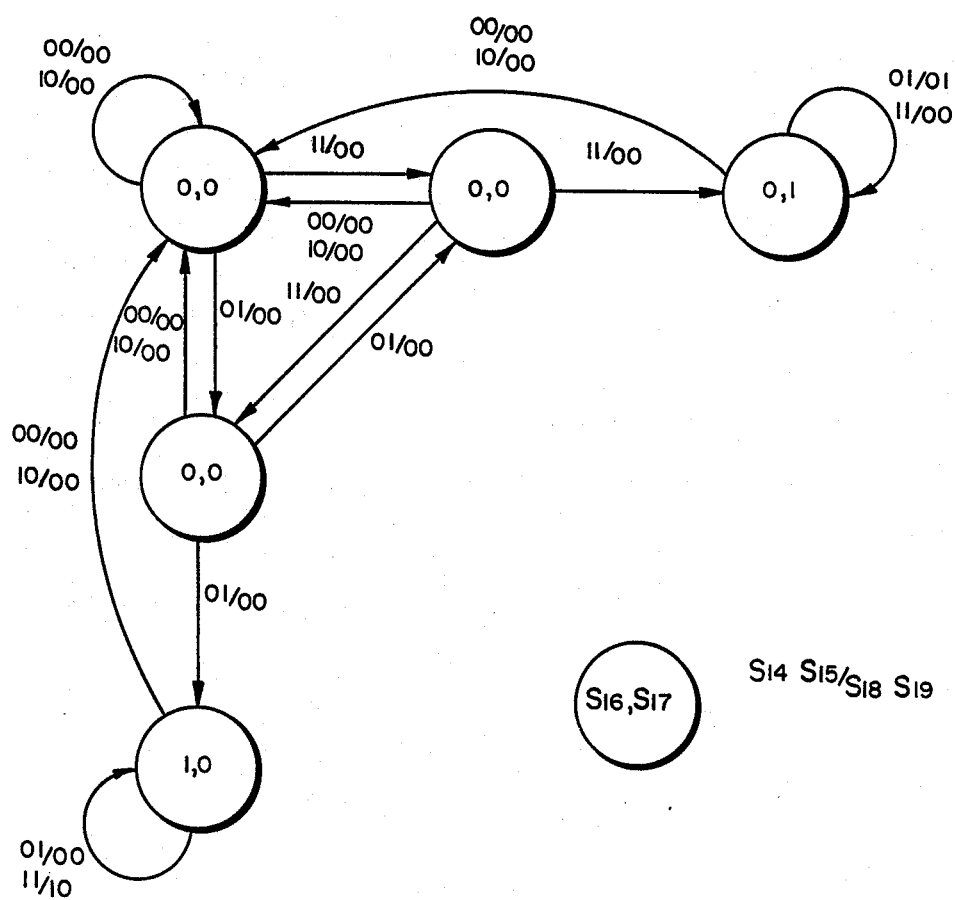
FIG. 15 is a logic state transition diagram for explaining the operation of the circuit in FIG. 14.

PLL 22 is equipped with four phase data storing circuits 78, 80, 96 and 98 as shown in FIG. 14 which can regulate clock signal $S_2$ against the drift of reference voltage V under the input conditions indicated by the "*" in FIG. 15.

Although hold circuit 62 is opened according to the output from hold control circuit 120 in the above example, any other means may be used instead of hold circuit 62 as long as it holds the input voltage applied to VCO 30. As an example, a means for holding the output voltage from LPF 28 may alternately be employed.

It is to be understood that the present invention is not limited to the above embodiments. Modifications and changes may be made therein without departing from the spirit and scope of the invention.

What is claimed is:

1. A phase-locked loop circuit for generating a reference signal in phase with an input signal, comprising:
    (a) means coupled to said input signal for producing a polarity inversion signal indicative of polarity inversions of said input signal;
    (b) means for generating said reference signal; and
    (c) means for comparing the phases of said polarity inversion signal and said reference signal and for generating a phase signal indicative of the phase difference between said polarity inversion signal and said reference signal, said phase signal being provided as an input to said reference signal generating means wherein said comparing means includes means for generating a first and a second phase direction signal according to said polarity inversion signal, said first phase direction signal having a pulse duration responsive to a phase difference between said polarity inversion signal and said reference signal, and said second phase direction signal being opposite in polarity to said first phase direction signal and having a fixed pulse duration equivalent to one half of the period of said reference signal, and
    wherein said reference signal generating means includes means connected to said comparing means for charging and combining said first and second phase direction signals and for generating an error signal indicative of the phase difference between said input signal and said reference signal, and means, receiving said error signal from said charging and combining means, for generating said reference signal.

2. The phase-locked loop circuit in claim 1 wherein said polarity inversion signal producing means includes:
    (a) a first D flip-flop having its data input coupled to said input signal and its clock input coupled to said reference signal;
    (b) a second D flip-flop having its data input connected to the non-inverting output of said first D flip-flop and its clock input coupled to said reference signal; and
    (c) an exclusive OR gate having one input coupled to said input signal and a second input connected to the non-inverting output of said second D flip-flop and generating at its output said polarity inversion signal.

3. The phase-locked loop circuit in claim 2 wherein said phase comparing means includes:
    (a) a third D flip-flop having its data input coupled to said polarity inversion signal;
    (b) an inverter whose input is coupled to said reference signal and whose output is coupled to the clock input of said third D flip-flop;
    (c) a fourth D flip-flop whose data input is coupled to the non-inverting output of said third D flip-flop and whose clock is coupled to said reference signal;
    (d) a first NAND gate having one input coupled to said polarity inversion signal, a second input coupled to the inverting output of said third D flip-flop and generating at its output said first phase direction signal; and
    (e) a first AND gate having one input connected to the non-inverting output of said third D flip-flop, a second input connected to the inverting output of said fourth D flip-flop and generating at its output said second phase direction signal.

4. The phase-locked loop circuit in claim 1 wherein said phase comparing means includes:
    (a) a fifth D flip-flop whose data input is coupled to said polarity inversion signal;
    (b) second and third inverters having inputs coupled to said reference signal, the output of said second inverter being connected to the clock input of said fifth D flip-flop;
    (c) a sixth D flip-flop whose data input is coupled to the non-inverting output of said fifth flip-flop and whose clock input is coupled to said reference signal;
    (d) a seventh D flip-flop whose data input is coupled to the non-inverting output of said sixth D flip-flop and whose clock input is connected to the output of said third inverter;
    (e) a second NAND gate having one input coupled to the inverting output of said fifth D flip-flop and a second input coupled to said polarity inversion signal and generating at its output said first phase direction signal; and
    (f) a second AND gate having one input connected to said non-inverting output of said sixth D flip-flop and a second input coupled to the inverting output of said seventh D flip-flop and generating at its output said second phase direction signal.

5. A phase-locked loop circuit according to claim 1 further comprising means coupled between said reference signal generating means and said comparing means for controlling said comparing means generation of said first and second phase direction signals according to the phase relationship of said polarity inversion signal and said reference signal.

6. A circuit for producing an output signal from an input signal representing information stored on an optical disc comprising:
 (a) a signal reproduction circuit for transforming said input signal into a bilevel signal;
 (b) means coupled to said bilevel signal for producing a polarity inversion signal indicative of polarity inversions of said bilevel signal;
 (c) means for generating a reference signal;
 (d) means for comparing the phases of said polarity inversion signal and said reference signal and for generating a phase signal representing the phase difference between said polarity inversion signal and said reference signal, said phase signal being provided as an input to said reference signal generating means, and said phase comprising means including means for generating a hysteresis signal when said phase difference is in a predetermined range;
 (e) a control signal processing circuit coupled to said hysteresis signal; and
 (f) a data strobe circuit coupled to said hysteresis signal, to said bilevel signal, and to said reference signal for producing said output signal, said data strobe circuit including:
  (i) a first AND gate having a first input connected to said bilevel signal and a second input coupled to the output of said control signal processing circuit,
  (ii) an inverter whose input is coupled to the output of said control signal processing circuit,
  (iii) a second AND gate having a first input connected to the output of said inverter and a second input coupled to said output signal,
  (iv) a NOR gate having two inputs coupled individually to the outputs of said first and second AND gates, and
  (v) a D flip-flop having a data input coupled to the output of said NOR gate and a clock input coupled to said reference signal, said flip-flop generating said output signal.

7. A phase-locked loop circuit for generating a reference signal in phase with an input signal, comprising:
 (a) means coupled to said input signal for producing a polarity inversion signal indicative of polarity inversions of said input signal;
 (b) a phase state detecting circuit for generating a phase state indicating signal and said reference signal;
 (c) means for comparing the phases of said polarity inversion signal and said phase state indicating signal, for generating a phase signal representing the phase difference between said polarity inversion signal and said reference signal, and for generating a phase control signal;
 (d) means, coupled to said phase comparing means, for generating an oscillation signal controlled by said phase signal, said oscillation signal being an input to said phase state detecting circuit; and
 (e) a control circuit responsive to said phase state indicating signal and to said phase control signal for generating mask signals to be sent to said phase comparing means to stop the generation of said phase signal and for generating control signals for said phase state detecting circuit and said oscillation signal generating means.

8. The phase-locked loop circuit in claim 7 wherein said phase state detecting circuit includes:
 (a) a frequency divider having a clock input coupled to said oscillation signal and generating at a first output terminal intermediate clock signals and generating at a second output terminal said reference signal; and
 (b) a phase holding circuit coupled to said phase state detection circuit control signal, said phase control signal, and said intermediate clock signals and generating said phase state indicating signal.

9. The phase-locked loop circuit of claim 7 wherein said phase comparing means includes means for generating a phase range signal if said phase difference is in a predetermined range and wherein said control circuit comprises:
 (a) first and second phase data storing circuits coupled to said phase control signal and to said phase state indicating signal and generating, respectively, first and second phase data signals;
 (b) first and second output mask control circuits coupled to said first and second phase data signals, to said phase state indicating signal, and to said polarity inversion signal and generating, respectively, first and second mask signals coupled to said phase comparison means;
 (c) a control signal producing circuit coupled to said polarity inversion signal, said phase state indicating signal and said phase range signal and generating said phase state detecting circuit control signal; and
 (d) a hold control circuit coupled to said phase state indicating circuit and to said first and second phase data signals and generating said oscillation signal generating means control signals.

10. A phase-locked loop circuit according to claim 9 further comprising:
 means connected to said phase state detecting circuit for detecting an alternate phase drift of said input signal and for generating a first control signal in response to said alternate phase drift.

11. The phase-locked loop circuit of claim 7 wherein said phase comparison means includes means for generating a phase range signal if said phase difference is in a predetermined range and wherein said control circuit comprises:
 (a) first through fourth phase data storing circuits coupled to said phase control signal and to said phase state indicating signal and generating, respectively, first through fourth intermediate phase signals;
 (b) first and second output producing circuits generating, respectively, first and second phase data signals, said first output producing circuit being coupled to said first and second intermediate phase signals and said second output producing circuit being coupled to said third and fourth intermediate phase signals;
 (c) first and second output mask control circuits coupled to said first and second phase data signals, respectively, to said phase state indicating signal, and to said polarity inversion signal and generating, respectively, first and second mask signals coupled to said phase comparison means;
 (d) a control signal producing circuit coupled to said polarity inversion signal, said phase state indicating signal and said phase range signal and generating said phase state detecting circuit control signal; and (e) a hold control circuit coupled to said phase state indicating signal and to said first and second phase data signals and generating said oscillation signal generating means control signals.

12. A phase-locked loop circuit according to claim 7 wherein said phase state detecting circuit includes:

means for detecting the relative phases of said reference signal and said polarity inversion signal and for generating a reference phase signal indicating the phase state of said reference signal, and wherein said control circuit includes means for storing said reference phase signal and means for generating mask signals to be sent to said comparing means in response to said phase state detecting circuit.

13. A data reproducing apparatus comprising:

(a) a phase-locked loop circuit for generating a reference signal in phase with an input signal, said phase-locked loop circuit including:

(i) means coupled to said input signal for detecting a polarity inversion of said input signal and for producing a signal indicative of the polarity inversion of said input signal, (ii) means for generating said reference signal, (iii) means coupled to said polarity inversion signal and said reference signal for generating a first and a second phase direction signal in response to said polarity inversion signal, said first phase direction signal having a pulse duration corresponding to a phase difference between said polarity inversion signal and said reference signal and said second phase direction signal having a polarity opposite to said first phase direction signal and having a fixed pulse duration equivalent to one half of the period of said reference signal, (iv) means connected to said phase direction signal generating means for combining said first and second phase direction signals and for generating an error signal, said error signal being an input to said reference signal generating means, and (v) means coupled between said reference signal generating means and said phase direction signal generating means for controlling said phase directing signal generating means' generation of said phase direction signals, said means selectively inhibiting the generation of said phase direction signals in response to said first phase direction signal and said polarity inversion signal; and (b) means connected to said input signal and said reference signal for strobing said input signal in phase with said reference signal.

14. A phase-locked loop circuit for generating a reference signal in phase with an input signal, comprising:

(a) means coupled to said input signal for producing a polarity inversion signal indicative of polarity inversions of said input signal;

(b) means for generating said reference signal;

(c) means for comparing the phases of said polarity inversion signal and said reference signal and for generating a phase signal indicative of the phase difference between said polarity inversion signal and said reference signal, said phase signal being provided as an input to said reference signal generating means; and (d) means, coupled to said polarity inversion signal producing means, to said phase comparing means, and to said reference signal generating means, for generating hysteresis characteristics when said phase difference is in a predetermined range.

* * * * *